US012813245B2

(12) United States Patent
Arima et al.

(10) Patent No.: US 12,813,245 B2
(45) Date of Patent: Nov. 24, 2026

(54) SEMICONDUCTOR DEVICE WITH CONDUCTIVE MEMBER COVERING PART OF A CONNECTION MEMBER

(71) Applicants: Kabushiki Kaisha Toshiba, Tokyo (JP); Toshiba Electronic Devices & Storage Corporation, Tokyo (JP)

(72) Inventors: Rie Arima, Komatsu Ishikawa (JP); Kazuki Matsuo, Nonoichi Ishikawa (JP); Masaru Izumisawa, Kanazawa Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 553 days.

(21) Appl. No.: 18/243,080

(22) Filed: Sep. 6, 2023

(65) Prior Publication Data

US 2024/0312875 A1 Sep. 19, 2024

(30) Foreign Application Priority Data

Mar. 15, 2023 (JP) ................................ 2023-041230

(51) Int. Cl.
*H10W 20/40* (2026.01)
*H10W 70/40* (2026.01)
(Continued)

(52) U.S. Cl.
CPC ......... *H10W 20/40* (2026.01); *H10W 70/481* (2026.01); *H10W 70/417* (2026.01);
(Continued)

(58) Field of Classification Search
CPC ..................................................... H10W 20/40
(Continued)

(56) References Cited

U.S. PATENT DOCUMENTS 6,630,726 B1 * 10/2003 Crowley ............. H10W 70/481
257/E23.044
2009/0194856 A1 * 8/2009 Gomez ............... H10W 70/481
257/676

(Continued)

FOREIGN PATENT DOCUMENTS

JP H02-249249 A 10/1990
JP 2014-179541 A 9/2014

(Continued)

OTHER PUBLICATIONS

Office Action issued in Japanese Patent Application No. 2023-041230, dated Mar. 25, 2026 in 10 pages.

*Primary Examiner* — Ajay Arora
(74) *Attorney, Agent, or Firm* — Knobbe, Martens, Olson & Bear, LLP

(57) ABSTRACT

According to one embodiment, a semiconductor device includes a metal base, a terminal separated from the metal base, a semiconductor chip including a back-surface-side electrode connected to the metal base and a front-surface-side electrode provided on a front surface opposite to the back-surface-side electrode, a connection member including a first end portion connected to the front-surface-side electrode of the semiconductor chip and a second end portion connected to the terminal, and a conductive member provided on the front-surface-side electrode of the semiconductor chip and covering a region of the front-surface-side electrode that is not connected to the first end portion of the connection member.

20 Claims, 5 Drawing Sheets

(51) Int. Cl.

| | |
|---|---|
| *H10W 72/00* | (2026.01) |
| *H10W 72/50* | (2026.01) |
| *H10W 72/60* | (2026.01) |
| *H10W 72/90* | (2026.01) |
| *H10W 90/00* | (2026.01) |

(52) U.S. Cl.
CPC ................. *H10W 72/07553* (2026.01); *H10W 72/07652* (2026.01); *H10W 72/531* (2026.01); *H10W 72/5449* (2026.01); *H10W 72/5475* (2026.01); *H10W 72/5524* (2026.01); *H10W 72/5525* (2026.01); *H10W 72/627* (2026.01); *H10W 72/652* (2026.01); *H10W 72/681* (2026.01); *H10W 72/884* (2026.01); *H10W 72/886* (2026.01); *H10W 72/936* (2026.01); *H10W 72/944* (2026.01); *H10W 90/736* (2026.01); *H10W 90/756* (2026.01); *H10W 90/766* (2026.01)

(58) Field of Classification Search
USPC .......................................................... 257/666
See application file for complete search history.

(56) References Cited

U.S. PATENT DOCUMENTS

| | | | | |
|---|---|---|---|---|
| 2013/0147064 | A1* | 6/2013 | Sato ...................... | H10W 70/20 257/777 |
| 2014/0231981 | A1* | 8/2014 | Kojima ................. | H10W 40/10 438/122 |
| 2014/0264383 | A1 | 9/2014 | Kajiwara et al. | |
| 2021/0280500 | A1 | 9/2021 | Inoue | |
| 2021/0280534 | A1 | 9/2021 | Hokazono et al. | |

FOREIGN PATENT DOCUMENTS

| | | | |
|---|---|---|---|
| JP | 2017-050441 | A | 3/2017 |
| JP | 2021-141235 | A | 9/2021 |
| JP | 2021-158180 | A | 10/2021 |
| WO | 2020-255773 | A1 | 12/2020 |

* cited by examiner

SEMICONDUCTOR DEVICE WITH CONDUCTIVE MEMBER COVERING PART OF A CONNECTION MEMBER

CROSS-REFERENCE TO RELATED APPLICATIONS

This application is based upon and claims the benefit of priority from Japanese Patent Application No. 2023-041230, filed on Mar. 15, 2023; the entire contents of which are incorporated herein by reference.

FIELD

Embodiments described herein relate generally to a semiconductor device.

BACKGROUND

A semiconductor device for power control is required to reduce a conduction loss and improve heat dissipation.

DETAILED DESCRIPTION

Figure 1A:
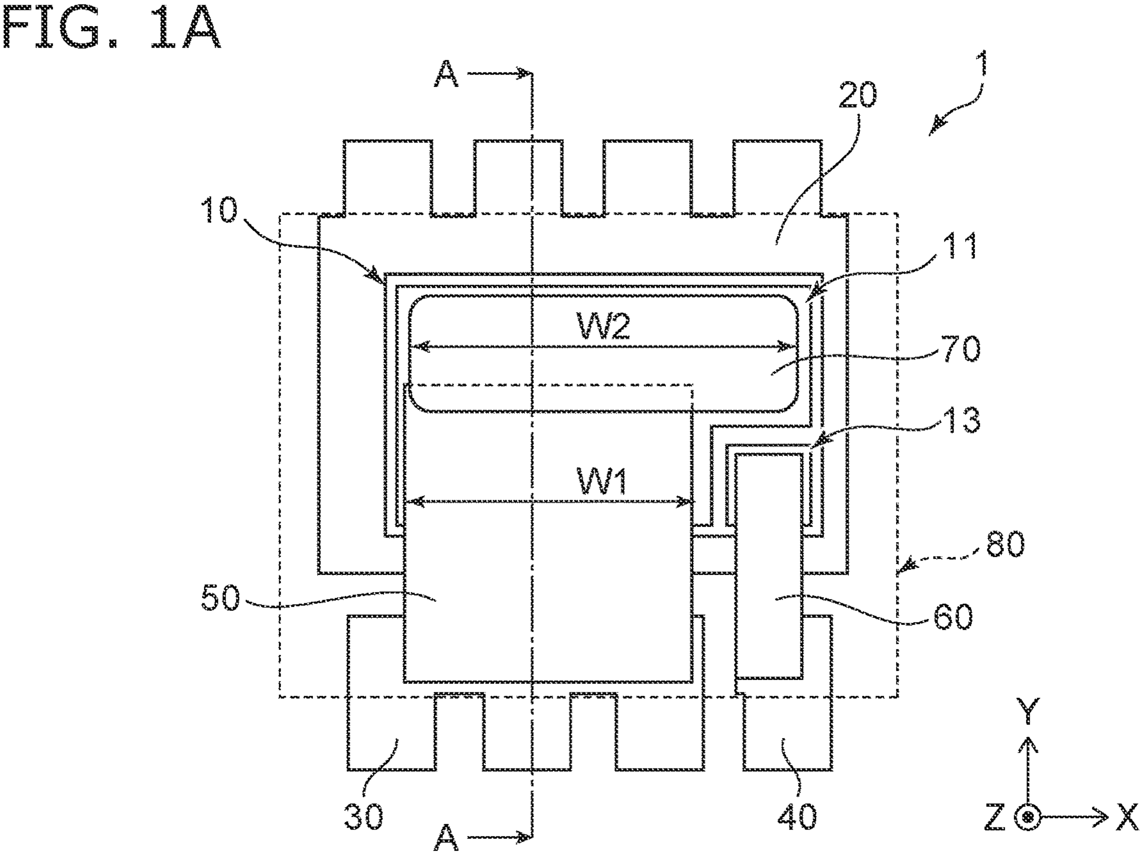
FIG. 1A is a schematic view showing a semiconductor device 1 according to a first embodiment.

In general, according to one embodiment, a semiconductor device includes a metal base, a terminal separated from the metal base, a semiconductor chip including a back-surface-side electrode connected to the metal base and a front-surface-side electrode provided on a front surface opposite to the back-surface-side electrode, a connection member including a first end portion connected to the front-surface-side electrode of the semiconductor chip and a second end portion connected to the terminal, and a conductive member provided on the front-surface-side electrode of the semiconductor chip and covering a region of the front-surface-side electrode that is not connected to the first end portion of the connection member.

Hereinafter, an embodiment will be described with reference to the drawings. A detailed description of the same portion in the drawings attached with the same reference sign will be omitted as appropriate, and a different portion will be described. The drawings are schematic or conceptual. A relationship between a thickness and a width of each portion, a ratio of sizes between portions, and the like are not necessarily the same as the actual ones. Even if same portions are shown, dimensions and ratios may be shown differently from each other in the drawings.

Next, an arrangement and a configuration of each part will be described using an X-axis, a Y-axis, and a Z-axis shown in each drawing. The X-axis, the Y-axis, and the Z-axis are orthogonal to one another and separately represent an X-direction, a Y-direction, and a Z-direction. The Z-direction may be described as an upper side, and an opposite direction of the Z-direction may be described as a lower side.

First Embodiment

Figure 1B:
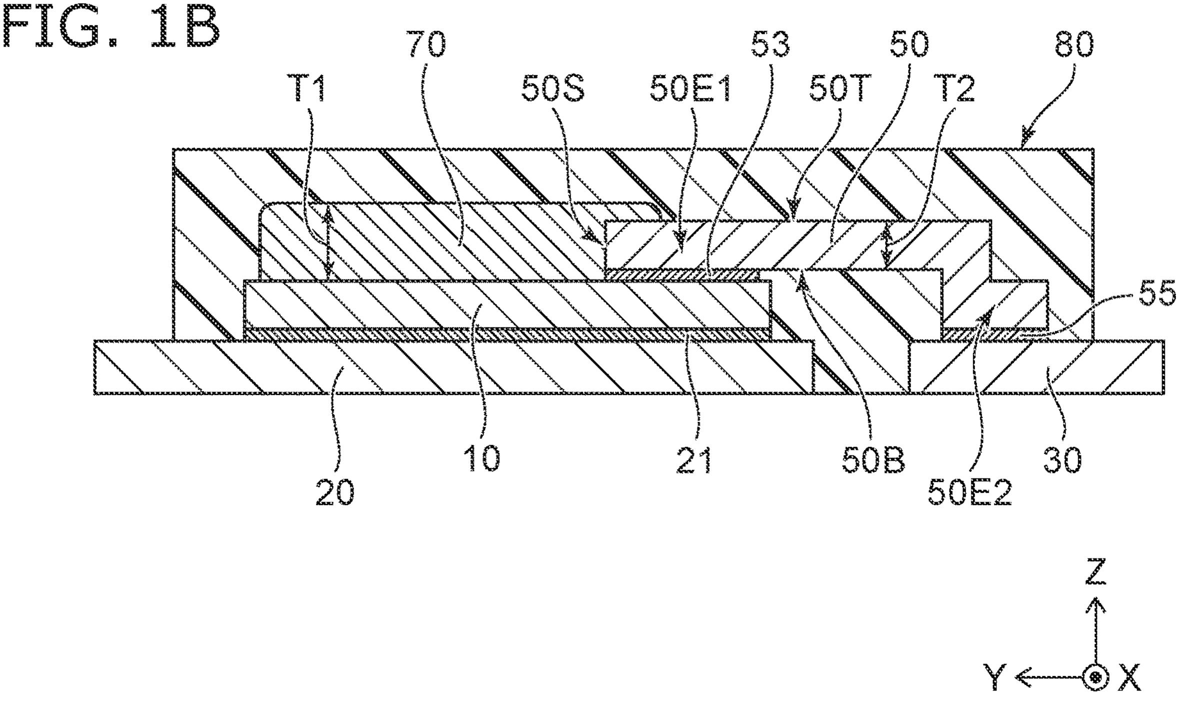
FIG. 1B is a schematic view showing a semiconductor device 1 according to a first embodiment.

FIGS. 1A and 1B are schematic views showing a semiconductor device 1 according to a first embodiment. FIG. 1A is a plan view, and FIG. 1B is a cross-sectional view taken along a line A-A shown in FIG. 1A.

As shown in FIG. 1A, the semiconductor device 1 includes a semiconductor chip 10, a metal base 20, a first terminal 30, a second terminal 40, a first connection member 50, and a second connection member 60. The semiconductor chip 10 is a power semiconductor such as a MOS transistor, an insulated gate bipolar transistor (IGBT), or a diode. In the following example, the semiconductor chip 10 is a MOS transistor.

The semiconductor chip 10 is mounted on the metal base 20. The metal base 20 is, for example, a metal plate containing copper or aluminum. The semiconductor chip 10 includes a front-surface-side electrode 11 provided on a front surface opposite from a back surface connected to the metal base 20, and a control pad 13. The control pad 13 is provided on the front surface of the semiconductor chip 10 so as to be separated from the front-surface-side electrode 11.

For example, the first terminal 30 and the metal base 20 are disposed side by side in the Y-direction. The second terminal 40 and the metal base 20 are also disposed side by side in the Y-direction. The first terminal 30 and the second terminal 40 are disposed, for example, side by side in the X-direction. The first terminal 30, the second terminal 40, and the metal base 20 are separated from one another. The first terminal 30 and the second terminal 40 contain, for example, the same material as the material of the metal base 20.

The first connection member 50 electrically connects the front-surface-side electrode 11 of the semiconductor chip 10 and the first terminal 30. The first connection member 50 is a so-called metal connector, and contains copper or aluminum. The first terminal 30 is, for example, a source terminal.

The second connection member 60 electrically connects the control pad 13 of the semiconductor chip 10 and the second terminal 40. The second connection member 60 is a so-called metal connector, and contains copper or aluminum. The second terminal 40 is, for example, a gate terminal.

The semiconductor device 1 further includes a conductive member 70. The conductive member 70 is provided on the front-surface-side electrode 11 of the semiconductor chip 10. The conductive member 70 covers a region of the front-surface-side electrode 11 that is not connected to the first connection member 50.

It is favorable that the conductive member 70 covers substantially the entire surface of the region of the front-surface-side electrode 11 that is not connected to the first connection member 50. The first connection member 50 has, for example, a first width W1 in the X-direction. The conductive member 70 has, for example, a second width W2 in the X-direction larger than the first width W1.

As shown in FIG. 1B, the semiconductor chip 10 is mounted on the metal base 20 via a bonding member 21. The bonding member 21 is, for example, a solder material. The semiconductor chip 10 is electrically connected to the metal base 20 via the bonding member 21. The metal base 20 is, for example, a drain terminal.

The first connection member 50 includes a first end portion 50E1 connected to the semiconductor chip 10 and a second end portion 50E2 connected to the first terminal 30. The first end portion 50E1 is connected to the front-surface-side electrode 11 of the semiconductor chip 10 via a bonding member 53. The second end portion 50E2 is connected to the first terminal 30 via a bonding member 55. The bonding members 53 and 55 are, for example, a solder material.

The conductive member 70 has a first thickness T1 in a direction perpendicular to the front surface of the semiconductor chip 10, for example, the Z-direction. The first connection member 50 has, for example, a second thickness T2 in the Z-direction. The first connection member 50 has a back surface 50B connected to the semiconductor chip 10, an upper surface 50T opposite from the back surface 50B, and a side surface 50S continuous to the back surface 50B and the upper surface 50T.

The conductive member 70 is at least in contact with the side surface 50S of the first end portion 50E1, and may cover the upper surface 50T of the first end portion 50E1 of the first connection member 50. In the example, it is described that the first thickness T1 of the conductive member 70 in the Z-direction is thicker than the second thickness T2 of the first connection member T2 in the Z-direction, but even when the first thickness T1 is thinner than the second thickness T2, the conductive member 70 may cover the upper surface 50T of the first end portion 50E1 of the first connection member 50. That is, the conductive member 70 may cover at least a part of the upper surface 50T of the first end portion 50E1 regardless of the thickness in the Z-direction. Accordingly, the conductive member 70 contacts and is electrically connected to the first connection member 50. The conductive member 70 is, for example, a solder material. The conductive member 70 may be a metal paste such as a silver paste or a copper paste. The conductive member 70 may be a conductive resin such as a conductive adhesive, a conductive silicone, or a conductive coating agent. In the case where the conductive member 70 is a paste or a conductive resin member, it is favorable that the first thickness T1 is thicker than the second thickness T2 of the first connection member 50.

The conductive member 70 may be made of the same material as the bonding member 53 or a material different from the bonding member 53. When the material of the conductive member 70 is the same as the material of the bonding member 53, affinity between the conductive member 70 and the bonding member 53 is improved, and bonding strength is increased. In addition, in the case where the material of the conductive member 70 is different from the material of the bonding member 53, at the time of forming the conductive member 70, it is easy to avoid a movement or the like of the first connection member 50 due to remelting of the bonding member 53.

The semiconductor device 1 further includes a sealing resin 80. The sealing resin 80 covers an assembly including the semiconductor chip 10, the metal base 20, the first terminal 30, the second terminal 40, the first connection member 50, and the second connection member 60. The sealing resin 80 seals the semiconductor chip 10 on the metal base 20. The sealing resin 80 is, for example, epoxy resin or polyimide.

In the semiconductor device 1 according to the embodiment, electrical resistance in a current path from the semiconductor chip 10 to the first connection member 50 can be reduced by providing the conductive member 70 on the front-surface-side electrode 11 of the semiconductor chip 10. Accordingly, on-resistance can be reduced, and a conduction loss can be reduced. Further, it is also possible to improve heat dissipation by transferring Joule heat generated in the semiconductor chip 10 to the first connection member 50 via the conductive member 70.

Further, by providing the conductive member 70 on the front-surface-side electrode 11 of the semiconductor chip 10, it is possible to reduce a connection area between the first connection member 50 and the front-surface-side electrode 11 without reducing the conductivity and thermal conductivity. For example, when the conductive member 70 is not provided, it is desirable to change a size of the first connection member 50 in accordance with the size of the semiconductor chip 10 mounted on the metal base 20. Accordingly, it is desired to increase the connection area between the first connection member 50 and the front-surface-side electrode 11 to improve the on-resistance and the thermal conductivity. On the other hand, in the semiconductor device 1 according to the embodiment, it is not necessary to fit a size of the first connection member 50 to the size of the semiconductor chip 10, so that a simplified manufacturing process and a low cost can be implemented.

Figure 2:
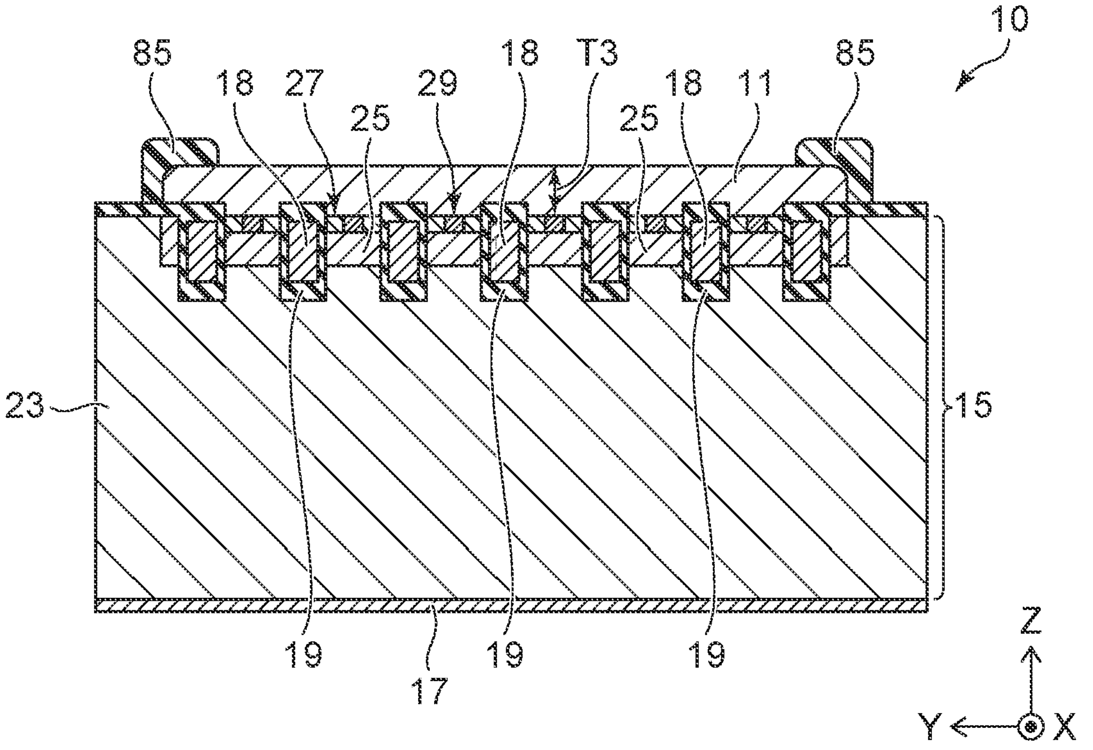
FIG. 2 is a schematic cross-sectional view illustrating the semiconductor chip according to the first embodiment.

FIG. 2 is a schematic cross-sectional view illustrating the semiconductor chip 10 according to the first embodiment. The semiconductor chip 10 includes the front-surface-side electrode 11, a semiconductor portion 15, a back-surface-side electrode 17, and a gate electrode 18.

The front-surface-side electrode 11 is, for example, a source electrode. The back-surface-side electrode 17 is, for example, a drain electrode. The back-surface-side electrode 17 is provided on a back surface of the semiconductor portion 15 and is connected to the metal base 20 via the bonding member 21. The front-surface-side electrode 11 is provided on the front surface of the semiconductor portion 15 opposite from the back surface.

The gate electrode 18 is provided on the front surface of the semiconductor portion 15 and has, for example, a trench gate structure. The gate electrode 18 is electrically insulated from the semiconductor portion 15 by a gate insulating film 19. The gate electrode 18 is electrically connected to the control pad 13 (see FIG. 1A).

The semiconductor portion 15 includes, for example, an n-type drift layer 23, a p-type body layer 25, an n-type source layer 27, and a p-type contact layer 29. The n-type drift layer 23 extends between the front-surface-side electrode 11 and the back-surface-side electrode 17. The p-type body layer 25 is provided between the n-type drift layer 23 and the front-surface-side electrode 11, and is positioned between the gate electrodes 18 adjacent to each other in the Y-direction.

The n-type source layer 27 is provided between the front-surface-side electrode 11 and the p-type body layer 25. The p-type contact layer 29 is also provided between the front-surface-side electrode 11 and the p-type body layer 25. For example, the n-type source layer 27 and the p-type contact layer 29 are disposed side by side along the front surface of the semiconductor portion 15 and connected to the front-surface-side electrode 11.

The front-surface-side electrode 11 has, for example, a third thickness T3 in the Z-direction. An outer edge of the front-surface-side electrode 11 is covered with, for example, a resin member 85. The resin member 85 is, for example, polyimide. The front-surface-side electrode 11 is connected to the first end portion 50E1 of the first connection member 50 at a portion exposed to an inside of the resin member 85. The conductive member 70 covers the inside of the resin member 85. It is favorable that the conductive member 70 is exposed to the inside of the resin member 85 of the front-surface-side electrode 11 and covers most of the region that is not connected to the first end portion 50E1.

For example, as the third thickness T3 of the front-surface-side electrode 11 increases, surface resistance is reduced and the thermal conductivity can be improved. However, it is not always easy to increase the third thickness T3. When the third thickness T3 is increased, for example, an internal stress of the semiconductor chip 10 increases, and a manufacturing yield may decrease.

In contrast, in the semiconductor device 1 according to the embodiment, it is not necessary to use a semiconductor chip in which the third thickness T3 is increased, and for example, by providing the conductive member 70 having the first thickness T1 thicker than the third thickness T3, the surface resistance of the front-surface-side electrode 11 can be reduced and the thermal conductivity can be improved. In other words, by reducing the thickness T3 of the front-surface-side electrode 11, the manufacture of the semiconductor chip 10 becomes easier, and a cost of the semiconductor chip 10 can be reduced.

Figure 3A:
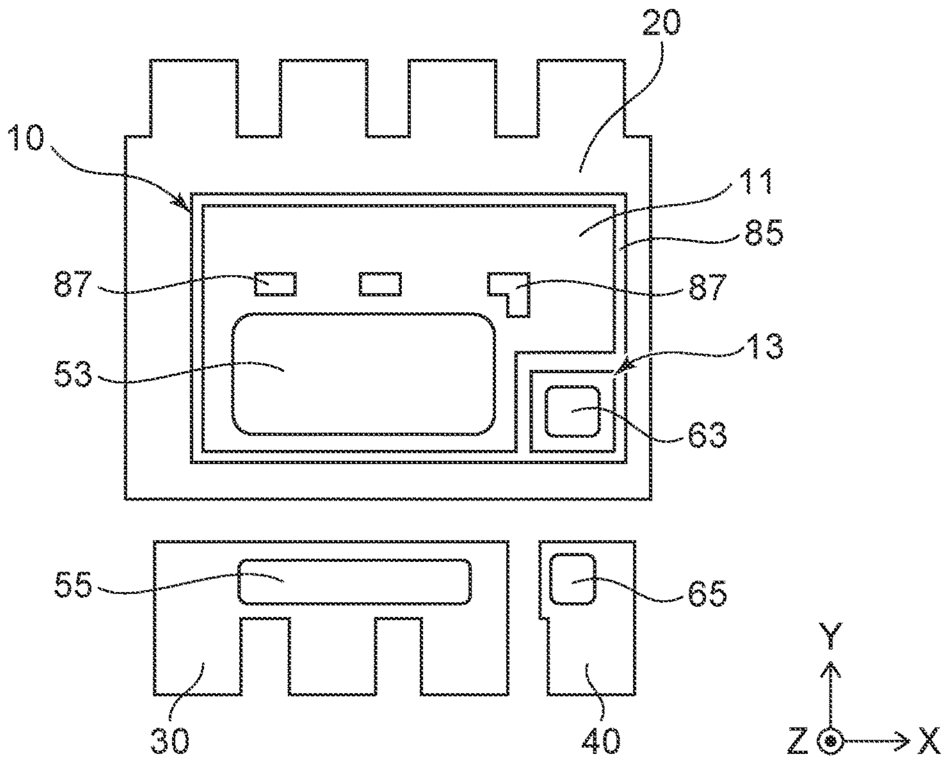
FIG. 3A is a schematic plan view showing a manufacturing process of the semiconductor device according to the first embodiment.
Figure 3B:
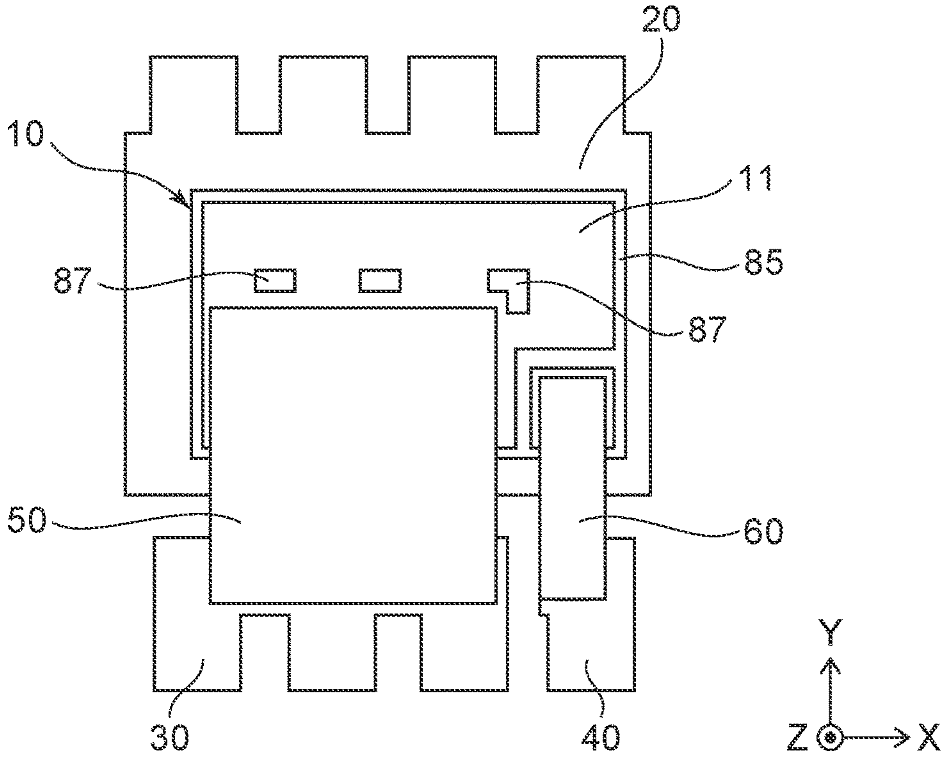
FIG. 3B is a schematic plan view showing a manufacturing process of the semiconductor device according to the first embodiment.

FIGS. 3A and 3B are schematic plan views showing a manufacturing process of the semiconductor device 1 according to the first embodiment. FIGS. 3A and 3B illustrate an upper surface of the metal base 20.

As shown in FIG. 3A, after the semiconductor chip 10 is mounted on the metal base 20, the bonding members 53 and 55 are applied on the front-surface-side electrode 11 of the semiconductor chip 10 and the first terminal 30, respectively. Bonding members 63 and 65 are applied onto the control pad 13 of the semiconductor chip 10 and the second terminal 40, respectively. The bonding members 53, 55, 63 and 65 are, for example, a cream solder.

For example, resin members 87 are provided on the front-surface-side electrode 11 of the semiconductor chip 10. The resin members 87 are disposed at a boundary between a region of the front-surface-side electrode 11 that is connected to the first connection member 50 and the region of the front-surface-side electrode 11 that is not connected to the first connection member 50. The resin member 87 is provided in a size at which an influence on electrical conduction and the thermal conduction between the front-surface-side electrode 11 and the conductive member 70 (see FIG. 1) can be ignored. The resin member 87 is, for example, polyimide. The resin member 87 is disposed as necessary, and may not be disposed.

As shown in FIG. 3B, the first connection member 50 is placed on the front-surface-side electrode 11 and the first terminal 30 and pressed from above. Accordingly, the first connection member 50 is connected to the front-surface-side electrode 11 of the semiconductor chip 10 via the bonding member 53, and is connected to the first terminal 30 via the bonding member 55. Similarly, the second connection member 60 is connected to the control pad 13 of the semiconductor chip 10 via the bonding member 63, and is connected to the second terminal 40 via the bonding member 65.

Subsequently, the assembly including the semiconductor chip 10, the metal base 20, the first terminal 30, the second terminal 40, the first connection member 50, and the second connection member 60 is carried into, for example, a reflow furnace and heated. Thereafter, the assembly is carried out of the reflow furnace and cooled. Thereby, the bonding members 53 and 55 are cured, and the first connection member 50 is fixed onto the front-surface-side electrode 11 of the semiconductor chip 10 and the first terminal 30. Similarly, the second connection member 60 is fixed onto the control pad 13 of the semiconductor chip 10 and the second terminal 40.

Further, the conductive member 70 (see FIGS. 1A and 1B) is applied onto the front-surface-side electrode 11 of the semiconductor chip 10 and cured. When the conductive member 70 is a solder material, after the conductive member 70 is applied, the assembly is heated again in the reflow furnace, carried out of the reflow furnace, and cooled.

In the process, when the bonding member 53 is melted and spread to the region of the front-surface-side electrode that is not connected to the first connection member 50, the first connection member 50 may move to an unintended position. The resin member 87 prevents the spread of the melted bonding member 53 and prevents the movement of the first connection member 50.

Figure 4A:
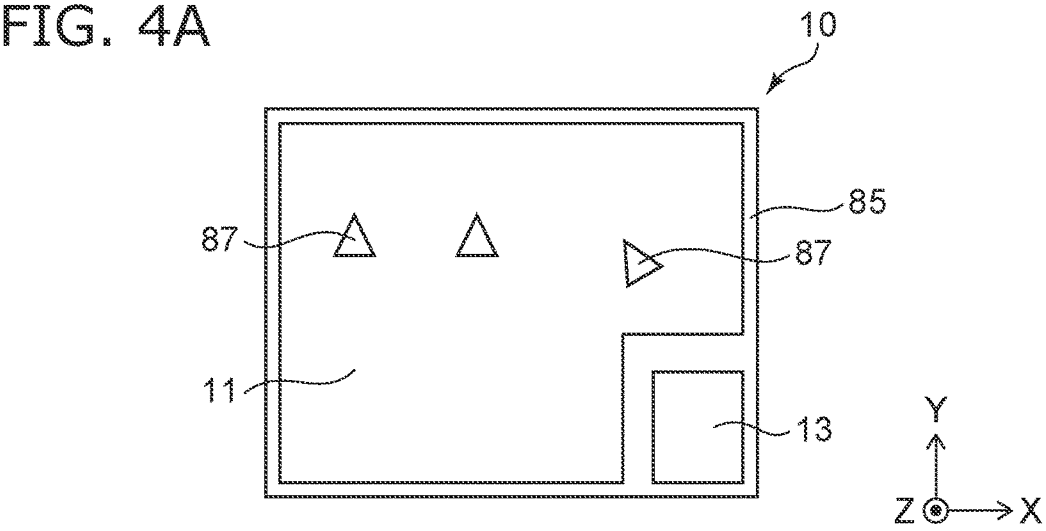
FIG. 4A is a schematic plan view showing the semiconductor chip according to the first embodiment.
Figure 4B:
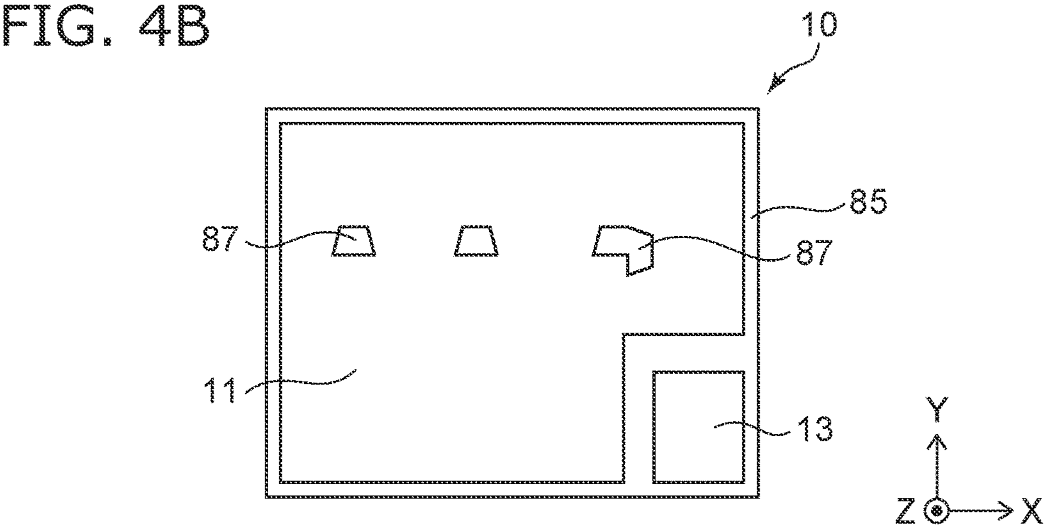
FIG. 4B is a schematic plan view showing semiconductor chip according to the first embodiment.
Figure 4C:
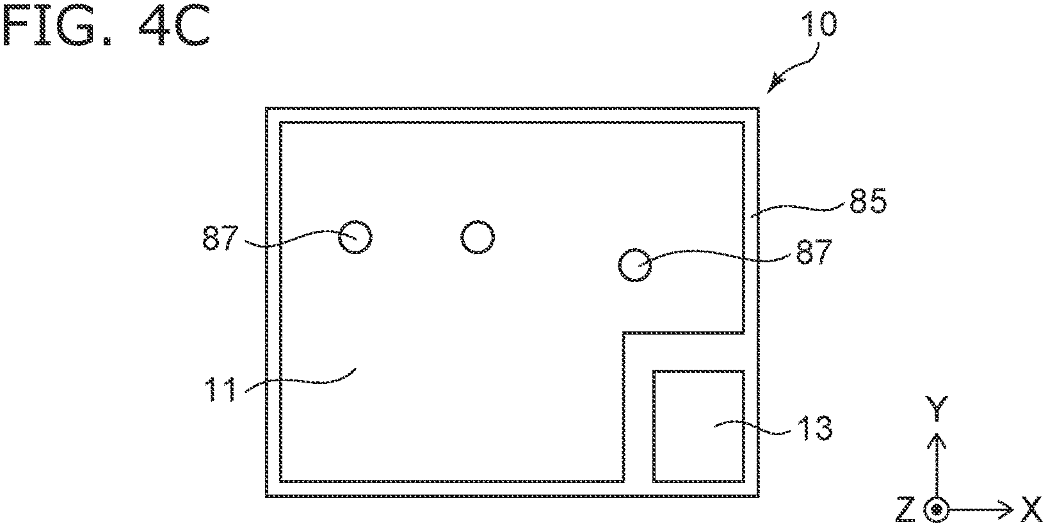
FIG. 4C is a schematic plan n view showing the semiconductor chip according to the first embodiment.

FIGS. 4A to 4C are schematic plan views showing the semiconductor chip 10 according to the first embodiment. FIGS. 4A to 4C show the front surface of the semiconductor chip 10. As shown in FIGS. 4A to 4C, multiple resin members 87 are provided on the front-surface-side electrode 11. The resin members 87 are separated from one another and disposed side by side in a direction along one side of the semiconductor chip 10, for example, the X-direction. A planar shape of the resin members 87 may be triangular, trapezoidal, or circular. That is, the resin members 87 have any planar shape.

Second Embodiment

Figure 5A:
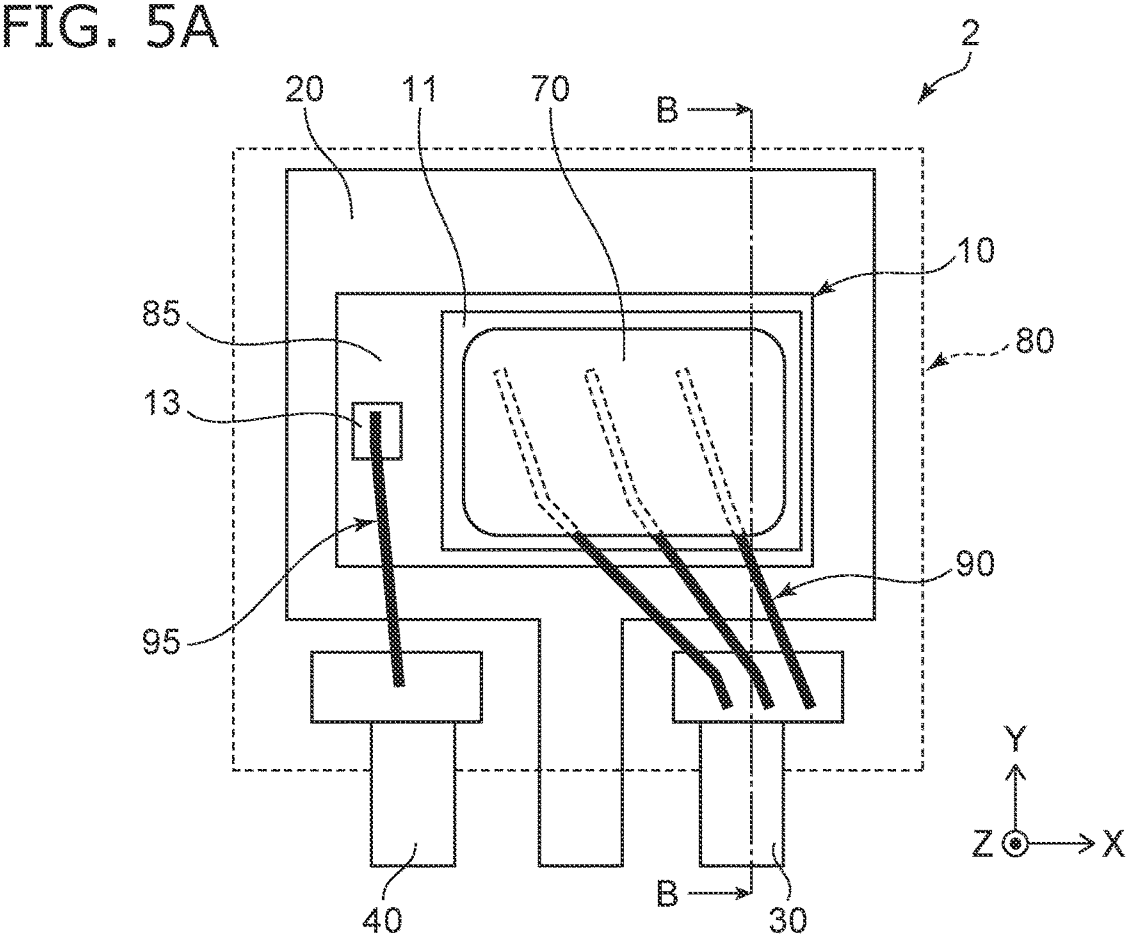
FIG. 5A is a schematic view showing a semiconductor device according to a second embodiment.
Figure 5B:
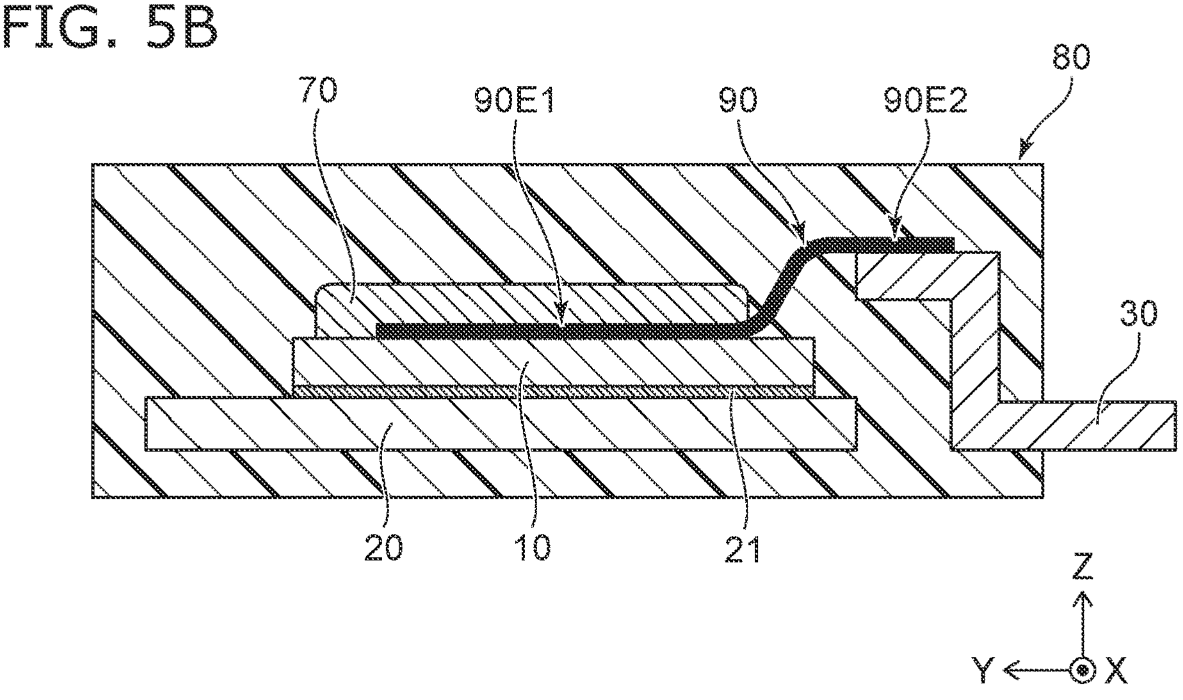
FIG. 5B is a schematic view showing a semiconductor device according to a second embodiment.

FIGS. 5A and 5B are schematic views showing a semiconductor device 2 according to a second embodiment. FIG. 5A is a plan view. FIG. 5B is a cross-sectional view taken along a line B-B shown in FIG. 5A.

As shown in FIG. 5A, the semiconductor device 2 includes the semiconductor chip 10, the metal base 20, the first terminal 30, and the second terminal 40. The semiconductor chip 10 is mounted on the metal base 20.

The metal base 20, the first terminal 30, and the second terminal 40 are separated from one another. The first terminal 30 is electrically connected to the front-surface-side electrode 11 of the semiconductor chip 10 via, for example, multiple metal wires 90. The second terminal 40 is electrically connected to the control pad 13 of the semiconductor chip 10 via, for example, a metal wire 95. The metal wires 90 and 95 are, for example, copper wires or aluminum wires.

The conductive member 70 is provided on the front-surface-side electrode 11 of the semiconductor chip 10. It is favorable that the conductive member 70 covers the metal wire 90. The conductive member 70 covers, for example, most of the front-surface-side electrode 11. It is favorable that the conductive member 70 covers the entire surface of the front-surface-side electrode 11 except for an outer edge covered with the resin member 85.

As shown in FIG. 5B, the semiconductor chip 10 is connected to the metal base 20 via the bonding member 21. The metal wire 90 includes a first end portion 90E1 connected to the semiconductor chip 10 and a second end portion 90E2 connected to the first terminal 30. The conductive member 70 covers the first end portion 90E1 of the metal wire 90.

An assembly including the semiconductor chip 10, the metal base 20, the first terminal 30, and the second terminal 40 is sealed in the sealing resin 80. A part of each of the metal base 20, the first terminal 30, and the second terminal 40 extends from the sealing resin 80.

Also in the example, by providing the conductive member 70 on the front-surface-side electrode 11 of the semiconductor chip 10, the surface resistance can be reduced and the thermal conductivity can be improved. For example, when the conductive member 70 is not provided on the front-surface-side electrode 11, the metal wire 90 is in contact with the front-surface-side electrode 11 on a bottom surface of the first end portion 90E1. Accordingly, a contact area between the front-surface-side electrode 11 and the metal wire 90 is limited. Even when the contact area is increased by increasing the number of metal wires 90, the number of metal wires 90 connectable to the front-surface-side electrode 11 is limited. In contrast, in the semiconductor device 2 according to the embodiment, by providing the conductive member 70 on the front-surface-side electrode 11, it becomes possible to electrically connect to the front-surface-side electrode 11 over the entire surface of the first end portion 90E1 of the metal wire 90. Accordingly, the on-resistance can be reduced, and the thermal conductivity via the metal wire 90 can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

Embodiments include the following aspects.

Note 1

A semiconductor device comprising:

a metal base;

a terminal separated from the metal base;

a semiconductor chip including a back-surface-side electrode connected to the metal base and a front-surface-side electrode provided on a front surface opposite to the back-surface-side electrode;

a connection member including a first end portion connected to the front-surface-side electrode of the semiconductor chip and a second end portion connected to the terminal; and a conductive member provided on the front-surface-side electrode of the semiconductor chip and covering a region of the front-surface-side electrode that is not connected to the first end portion of the connection member.

Note 2

The device according to note 1, wherein the conductive member at least partially covers the first end portion of the connection member.

Note 3

The device according to note 1, wherein the connection member has a back surface connected to the front-surface-side electrode and a front surface opposite to the back surface, and the conductive member partially covers the front surface of the first end portion of the connection member.

Note 4

The device according to any one of notes 1 to 3, wherein a thickness of the conductive member is larger than a thickness of the front-surface-side electrode in a direction perpendicular to the front surface of the semiconductor chip.

Note 5

The device according to any one of notes 1 to 3, wherein a thickness of the conductive member is larger than a thickness of the connection member in a direction perpendicular to the front surface of the semiconductor chip.

Note 6

The device according to any one of notes 1 to 5, further comprising:

a bonding member provided between the first end portion of the connection member and the front-surface-side electrode, wherein the bonding member contains a material different from a material of the conductive member.

Note 7

The device according to any one of notes 1 to 6, further comprising:

a bonding member provided between the first end portion of the connection member and the front-surface-side electrode, wherein the bonding member contains a material same as a material of the conductive member.

Note 8

The device according to any one of notes 1 to 7, further comprising:

a resin member provided at a boundary between a region of the front-surface-side electrode that is connected to the first end portion of the connection member and a region of the front-surface-side electrode that is not connected to the first end portion.

Note 9

The device according to any one of notes 1 to 8, wherein the metal base and the terminal are disposed side by side in a first direction, the connection member has a first width in a second direction that is along the front-surface-side electrode and is orthogonal to the first direction, and the conductive member has a second width in the second direction, and the first width is narrower than the second width.

Note 10

The device according to notes 1 or 2, wherein the connection member is a plate-shaped metal connector, and has a back surface connected to the front-surface-side electrode, a front surface opposite to the back surface, and a side surface continuous to the back surface and the front surface, and the conductive member is at least in contact with the side surface in the first end portion.

Note 11

The device according to any one of notes 1 to 9, wherein the connection member is a metal wire, and the conductive member covers the front-surface-side electrode and is in contact with the first end portion of the metal wire.

Note 12

The device according to any one of notes 1 to 9, wherein the connection member is a metal wire, and the conductive member covers the front-surface-side electrode and the first end portion of the metal wire.

What is claimed is:

1. A semiconductor device comprising:

a metal base;

a terminal separated from the metal base;

a semiconductor chip including a back-surface-side electrode connected to the metal base and a front-surface-side electrode provided on a front surface opposite to the back-surface-side electrode;

a connection member including a first end portion connected to the front-surface-side electrode of the semiconductor chip and a second end portion connected to the terminal;

a conductive member provided on the front-surface-side electrode of the semiconductor chip and the first end portion, and directly contacting the front-surface-side electrode of the semiconductor chip and the first end portion, the first end portion disposed between the conductive member and the front-surface-side electrode of the semiconductor chip; and a bonding member provided between the first end portion of the connection member and the front-surface-side electrode, wherein the bonding member contains a material different from a material of the conductive member.

2. The device according to claim 1, wherein the conductive member at least partially covers the first end portion of the connection member.

3. The device according to claim 1, wherein the connection member has a back surface connected to the front-surface-side electrode and a front surface opposite to the back surface, and the conductive member partially covers the front surface of the first end portion of the connection member.

4. The device according to claim 1, wherein a thickness of the conductive member is larger than a thickness of the front-surface-side electrode in a direction perpendicular to the front surface of the semiconductor chip.

5. The device according to claim 1, wherein a thickness of the conductive member is larger than a thickness of the connection member in a direction perpendicular to the front surface of the semiconductor chip.

6. The device according to claim 1, wherein the metal base and the terminal are disposed side by side in a first direction, the connection member has a first width in a second direction that is along the front-surface-side electrode and is orthogonal to the first direction, and the conductive member has a second width in the second direction, and the first width is narrower than the second width.

7. The device according to claim 1, wherein the connection member is a plate-shaped metal connector, and has a back surface connected to the front-surface-side electrode, a front surface opposite to the back surface, and a side surface continuous to the back surface and the front surface, and the conductive member is at least in contact with the side surface in the first end portion.

8. The device according to claim 1, wherein the connection member is a metal wire, and the conductive member covers the front-surface-side electrode and is in contact with the first end portion of the metal wire.

9. The device according to claim 1, wherein the connection member is a metal wire, and the conductive member covers the front-surface-side electrode and the first end portion of the metal wire.

10. The device according to claim 1, wherein the first end portion is disposed between the conductive member and the front-surface-side electrode of the semiconductor chip in a direction perpendicular to the front surface of the semiconductor chip.

11. A semiconductor device comprising:

a metal base;

a terminal separated from the metal base;

a semiconductor chip including a back-surface-side electrode connected to the metal base and a front-surface-side electrode provided on a front surface opposite to the back-surface-side electrode;

a connection member including a first end portion connected to the front-surface-side electrode of the semiconductor chip and a second end portion connected to the terminal;

a conductive member provided on the front-surface-side electrode of the semiconductor chip and the first end portion, and directly contacting the front-surface-side electrode of the semiconductor chip and the first end portion, the first end portion disposed between the conductive member and the front-surface-side electrode of the semiconductor chip; and a resin member provided at a boundary between a region of the front-surface-side electrode that is connected to the first end portion of the connection member and a region of the front-surface-side electrode that is not connected to the first end portion.

12. The device according to claim 11, wherein the conductive member at least partially covers the first end portion of the connection member.

13. The device according to claim 11, wherein the connection member has a back surface connected to the front-surface-side electrode and a front surface opposite to the back surface, and the conductive member partially covers the front surface of the first end portion of the connection member.

14. The device according to claim 11, wherein a thickness of the conductive member is larger than a thickness of the front-surface-side electrode in a direction perpendicular to the front surface of the semiconductor chip.

15. The device according to claim 11, wherein a thickness of the conductive member is larger than a thickness of the connection member in a direction perpendicular to the front surface of the semiconductor chip.

16. The device according to claim 11, wherein the metal base and the terminal are disposed side by side in a first direction, the connection member has a first width in a second direction that is along the front-surface-side electrode and is orthogonal to the first direction, and the conductive member has a second width in the second direction, and the first width is narrower than the second width.

17. The device according to claim 11, wherein the connection member is a plate-shaped metal connector, and has a back surface connected to the front-surface-side electrode, a front surface opposite to the back surface, and a side surface continuous to the back surface and the front surface, and the conductive member is at least in contact with the side surface in the first end portion.

18. The device according to claim 11, wherein the connection member is a metal wire, and the conductive member covers the front-surface-side electrode and is in contact with the first end portion of the metal wire.

19. The device according to claim 11, wherein the connection member is a metal wire, and the conductive member covers the front-surface-side electrode and the first end portion of the metal wire.

20. The device according to claim 11, wherein the first end portion is disposed between the conductive member and the front-surface-side electrode of the semiconductor chip in a direction perpendicular to the front surface of the semiconductor chip.

* * * * *